United States Patent [19]
Wang et al.

[11] Patent Number: 5,538,554
[45] Date of Patent: Jul. 23, 1996

[54] APPARATUS FOR DISPENSING INK FOR SEMICONDUCTOR DEVICE TESTERS

[75] Inventors: Chin-Ting Wang; Chia-Pin Liu, both of Hsinchu, Taiwan

[73] Assignee: Taiwan Semiconductor Manufacturing Company, Hsinchu, Taiwan

[21] Appl. No.: 365,048

[22] Filed: Dec. 27, 1994

[51] Int. Cl.⁶ ........................................................ B05C 5/00
[52] U.S. Cl. ............................ 118/256; 222/173; 222/174; 222/181.1; 346/139 R
[58] Field of Search ............................ 118/256; 222/173, 222/174, 181.1; 346/139 R, 140.1, 139 A

[56] References Cited

U.S. PATENT DOCUMENTS

| | | | |
|---|---|---|---|
| 4,540,994 | 9/1985 | Lawrence | 346/139 R |
| 5,285,218 | 2/1994 | Tanaka | 346/139 R |
| 5,361,963 | 11/1994 | Ozawa et al. | 118/256 |

*Primary Examiner*—Laura Edwards
*Attorney, Agent, or Firm*—George O. Saile; William J. Stoffel

[57] ABSTRACT

An apparatus for dispensing ink onto a semiconductor chip in a semiconductor device tester, the apparatus comprising a ring shaped support for attachment to the inside wall of a test head of the semiconductor tester; a pedestal slidably supported on the ring shaped support; vertical, lateral, and angular adjustment mechanisms on the ring shaped support for adjusting the position of the pedestal; locking screws to secure the vertical, lateral and angular adjustments: and a mounting bracket for mounting an ink dispenser on the end of pedestal away from the ring shaped support whereby the ink dispenser can be aligned using the adjusting mechanism to place ink on a semiconductor chip.

14 Claims, 3 Drawing Sheets

FIG. 1 — Prior Art

APPARATUS FOR DISPENSING INK FOR SEMICONDUCTOR DEVICE TESTERS

BACKGROUND OF THE INVENTION

1. Field of the Invention

This invention relates to test equipment for integrated circuits and semiconductor devices. It relates particularly to an apparatus for semiconductor device testers for marking computer chips with ink.

2. Description of the Prior Art

Semiconductor device testers and more particularly, the Trillium™ tester model micro-master II (FIG. 1) 10 (Trillium is a trademark of LTX corporation, 3970 North First street, San Jose, Calif.) is used to electrically test semiconductor chips on a wafer to determine individual chip performance and yields.

When a chip fails an electrical test, the tester 10 places a round ink spot on the chip so the chip can be rejected in later processing, such as in wafer slice and chip picking operations. In subsequent processing steps, computer chips having an ink spot will be separated from the good chips.

A major shortcoming of the current electrical testers and more particularly Trillium™ testers Model micro-master-II is that excessive effort and time is required to change the device that puts the ink on the chips (inker). The prior art mounting of the ink dispenser makes changing and aligning the ink dispenser difficult and time consuming. Also, its location makes it difficult to work on and make adjustments.

The tester comprises a test head and a prober station. In operation the prober station moves into position under the test head. A wafer is positioned on a chuck that moves from an unload/load position to a test position under the prober opening in the stage.

An ink dispenser is mounted on a stage overhanging the wafer/chuck in the test position. The ink dispenser is device which marks ink on to an underlying computer chip. In operation the chuck moves the computer chips into test positions and chip marking position. The ink dispenser is cable connected to a pen box controller that sends electrical signals to a pen driver mechanism that moves a pen into contact with a chip thus marking the chip with ink. Moreover, the alignment of the ink dispenser to the chuck is critical to ensure that the correct chip is properly marked in the center of the chip.

During the repeated testing and marking of computer chips, the ink dispenser can vibrate out of alignment causing the ink spots produced to be misaligned or imperfect in shape. Also, periodically the ink dispenser runs out of ink and must be replaced. However, with the current arrangement, replacing and aligning the ink dispenser is very labor intensive and requires over one half hour to reset/realign the ink dispenser in the correct position in relationship to the chip.

SUMMARY OF THE INVENTION

It is an object of the present invention to provide a new structure for an ink dispensing apparatus for a Trillium™ tester model micro-master II and for other testers that reduces the amount of time to replace and reposition the ink dispenser.

It is another object of the present invention to provide a new structure for an apparatus for dispensing ink for a semiconductor tester and more particularly, a Trillium™ tester model micro-master II, so that the ink dispenser can be replaced without requiring extensive realignment of the ink dispenser.

To meet these objectives, the present invention provides an apparatus for dispensing ink onto a semiconductor chip in a semiconductor device tester. The apparatus comprises a ring shaped support 42 attached to the inside wall of the test head of the semiconductor tester. A pedestal 44 is slidably attached to the ring shaped support 42. Vertical, lateral, and angular adjustment means are provided on the ring shaped support for adjusting the vertical, lateral, and angular positions of the pedestal and with the ink dispenser. Also, a means for mounting an ink dispenser 58 on the end of pedestal 44 away from the ring shaped support 42 is provided. Moreover, the ink dispenser 58 can be aligned with a minimum amount of setup time and labor using the vertical, lateral, and angular adjusting means to accurately place ink on a semiconductor chip.

DETAILED DESCRIPTION OF THE PREFERRED EMBODIMENTS

An improved ink dispensing apparatus for semiconductor device testers and more particularly, Trillium™ tester models including the Micro-Master - II model, has been developed which facilitates quick, and accurate changing and alignment of an ink dispenser.

Figure 1:
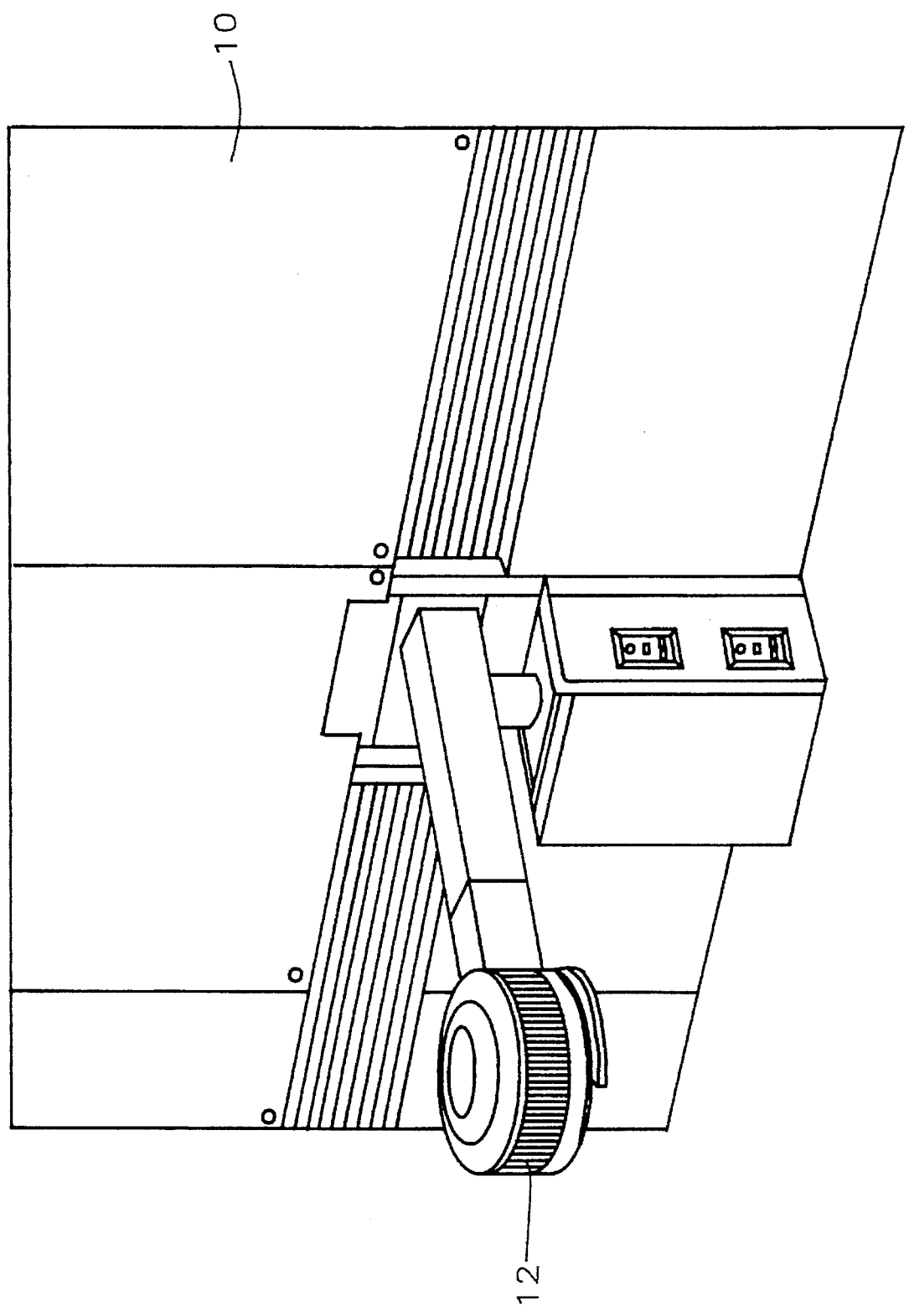
FIG. 1 is a three dimensional view of a Trillium™ tester model micro-master (with some elements schematically represented) including a tester head and probing station of the prior art.
Figure 2:
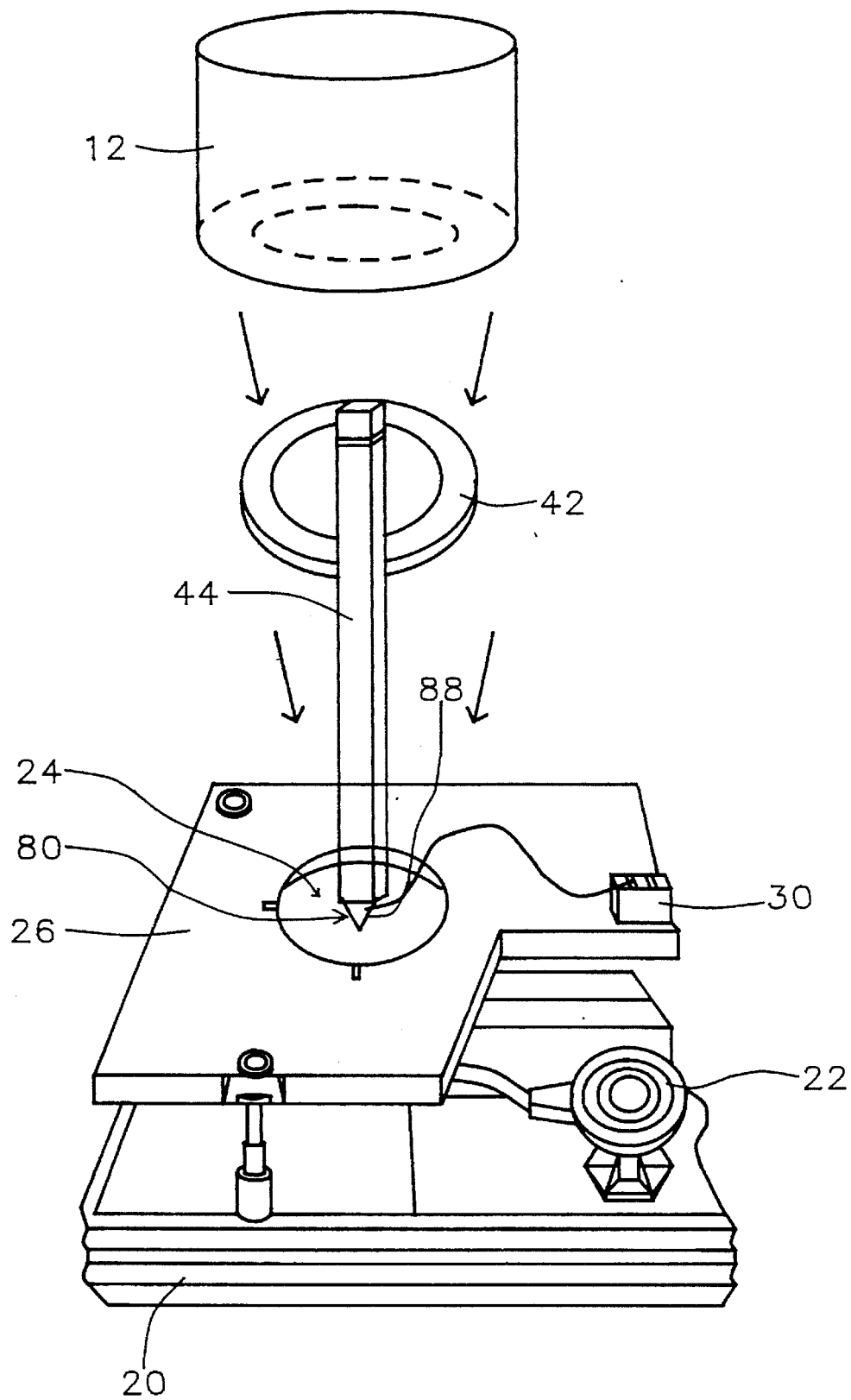
FIG. 2 is a three dimensional view of the probing station, tester head and ink dispensing apparatus of the present invention.
Figure 3:
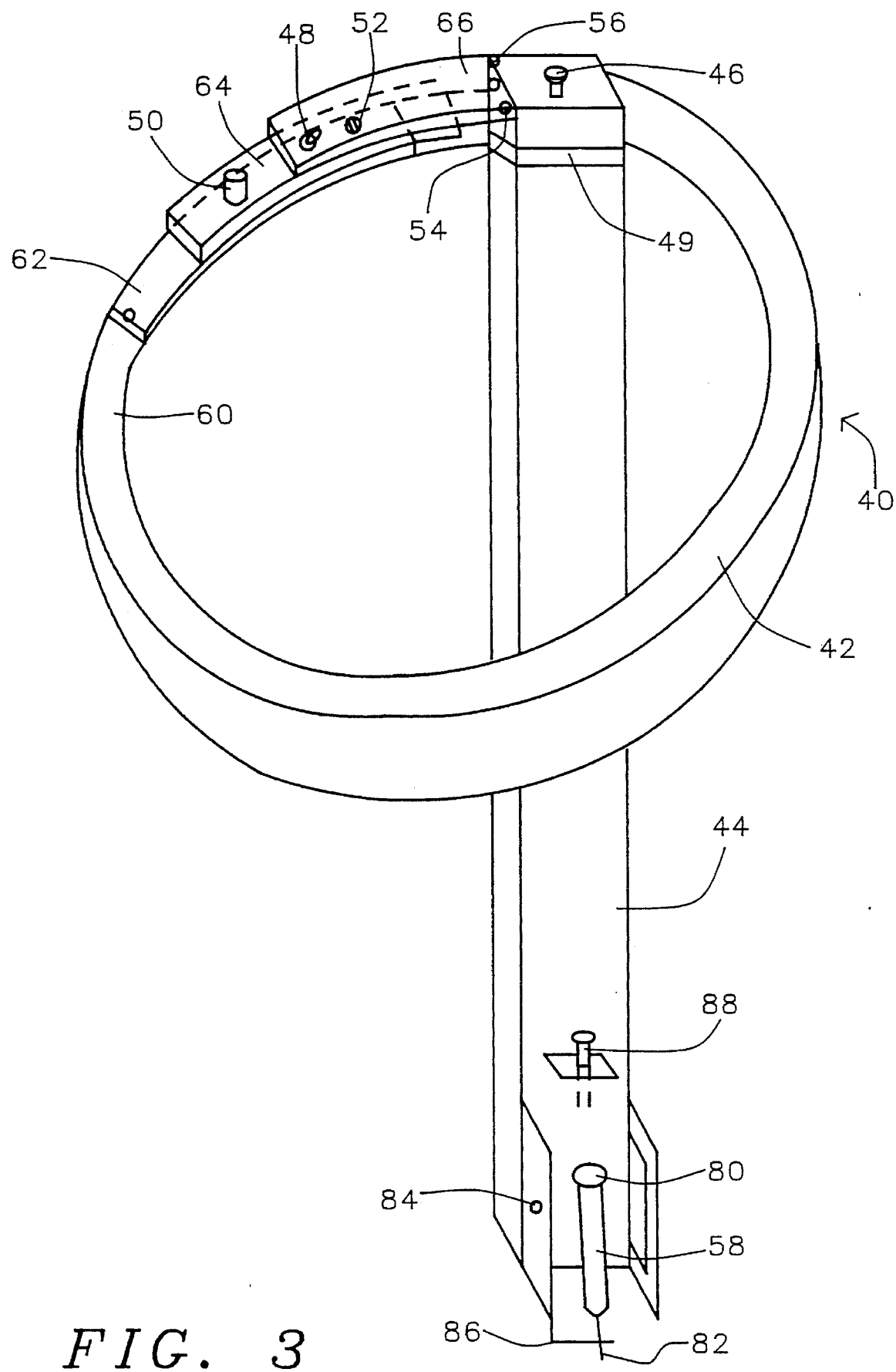
FIG. 3 is three dimensional view of the apparatus for dispensing ink of the present invention.

The apparatus for dispensing ink 40 (inking kit) is comprised of the components shown in FIG. 2 and 3. A ring shaped support 42 is attached to the inside wall of the test head 12 of the semiconductor tester. In the preferred embodiment of the present invention, the support 42 includes a ring 60, a first stage 62, a second stage 64, and a third stage 66. The ring support 42 includes many components 46 48 49 50 52 54 56 60 62 64 66 that are used to adjust the alignment and position of the support 42, pedestal 44 and the ink dispenser 58.

The apparatus 40 of the present invention includes:
40 apparatus for dispensing ink of the present invention
42 ring shaped support (mother kit)
44 pedestal
46 vertical adjuster screw
48 joy stick (lateral adjustment)
49 bracket
50 angle control screw
52 first locking screw (angle locking screw)
54 guide pins
56 second locking screw (pedestal locking screw)
58 ink dispenser
60 ring
62 first stage
64 second stage
66 third stage
80 Ink compartment 82 pen
84 ink dispenser adjusting screw
86 ink dispenser holder
88 pen driving mechanism The ring shaped support 42 is attached on the inside wall of the tester head 12. Preferably, the ring shaped support 42 is attached using screws which can be removed to easily unfasten the support. Properly positioning and leveling the ring shaped support 42 requires considerable precision since the support controls the positions of the ink dispenser 58 that must be kept in a 3–5 mm tolerance to ensure the ink is properly marked on the center of the computer chips.

A pedestal 44 is slidably attached to the ring shaped support 42. The pedestal can be about approximately 18 cm in length. The pedestal 44 is vertically slidably supported on the ring shaped support 42. In a preferred embodiment, the pedestal 44 is slidably attached to the support 42 by a (slidably mounting) bracket 49 as shown in FIG. 3. Bracket 49 holds the pedestal 44 in a lateral position, but allows the pedestal to slide up and down. This arrangement has the advantage of allowing the pedestal to slide upward, raising the ink dispenser, thus allowing easy access to the ink dispenser for maintenance. After the ink dispenser is changed, the pedestal can be lowered. If the raising and lowering of the pedestal is performed carefully, either no or minimal realignment of the ink dispenser is required.

A vertical adjustment means is provided on the ring shaped support 42 for adjusting the vertical position of the pedestal. Adjusting the pedestal 44 also adjusts the ink dispenser 58 since the ink dispenser is positioned on the end of the pedestal. In a preferred embodiment, the vertical adjusting means comprises a vertical adjustment screw 46 mounted on a bracket 49. The bracket 49 slidably holds the pedestal 44 whereby tightening or loosing the vertical adjustment screw 46 raises or lowers the pedestal in relationship with the support 42.

The support 42 further comprises a lateral adjustment means for adjusting the lateral position of the pedestal 44. In a preferred embodiment, a joy stick 48 is used to control the movement of the ink dispenser. The joystick 48 is mounted on the third stage and is connected to the second stage 64 whereby adjusting the joystick laterally moves the ink dispenser 58 on the pedestal 44. The joystick pivots in a hole in the third stage 66 that changes the amount of overlap between the second and third stages 64 66 thereby laterally moving the pedestal 44. Therefore, if the ink dot is not on the center of the chip, the joy stick 48 can be used to align the ink dispenser to the left and right, forward and backwards to align the ink dispenser in the center of the chip.

An angular adjustment means is provided on the ring shaped support 42 for adjusting the angle of the pedestal in relation to the semiconductor chip. The angle controller mechanism 50 is used to control the angle the ink dispenser with the chip. As shown in FIG. 3, an angle adjusting screw 50 secures the second stage 64 and the angle adjusting screw is connected to the first stage 62. Therefore, the angle adjusting screw 50 controls the distance between the first stage and second stage thus controlling the angle of the pedestal. Since the pedestal is indirectly connected with the first and second stages (through the third stage 66 and the ring 60), the angle adjustment screw can be used to adjust the pedestal 44 angle by changing the distance between the first and second stages.

The ink dispenser 58 can be aligned using the vertical, lateral, and angular adjusting means to place ink on a semiconductor chip. These vertical, lateral, and angular adjustments are secured by various locking means. In a preferred embodiment, the locking means comprises a first locking screw 52 securing the second stage 64 and the third stage 66 in position; and a second locking screw 56 securing the pedestal 44 in vertical position within the bracket 49 as shown in FIG. 3.

Moreover, in a preferred embodiment, the third stage further comprises guide pins 54. The guide pins 54 allows easy docking of the ring shaped support 42 to the pedestal 44.

The ink dispenser 58 is attached to the end of the pedestal 44 by a means for mounting an ink dispenser 58 on the end of pedestal 44 away from the ring shaped support 42. In a preferred embodiment, the ink dispenser 58 is mounted on the end of the pedestal 44 by a holder 86 as shown in FIG. 3.

In another preferred embodiment, a holder 86 including an ink dispenser adjusting screw 84, is attached to the pedestal 44. The ink dispenser 58 is held in the holder 86 by the ink dispenser adjustment screw 84. The ink dispenser can move vertically in the holder 86 and the adjustment screw 84 is used to secure the ink dispenser 58 in the proper vertical location.

In yet another preferred embodiment, the ink dispenser 58 comprises an ink compartment 80, a pen 82 and a pen driving mechanism 88. The pen driving mechanism is attached to an electrical controller that activates the pen driving mechanism that pushes a pen forward in contact with the chip, thus marking the chip.

The ink compartment 80 that holds ink must be changed when the ink in the compartment is consumed. To change the ink compartment, the first locking screw 52 and pedestal locking screw (second locking screw) 56 are loosened. The pedestal 44 is then raised. Next the ink dispenser 58 is removed from the ink dispenser holder bracket 86. A new ink dispenser 58 is inserted into the ink dispenser holder 86. The pedestal 44 is lowed into position. Next, the pedestal 44 is docked into the guide pin 54 and the first and second locking screws 52 56 are secured. If required, vertical, lateral, and angular alignment adjustments are made with the vertical control adjuster 46, the joy stick 48 lateral and angle control screw 50.

The apparatus of the present invention has the advantage of significantly reducing the setup and alignment time for the ink dispenser of a chip testing device. The instant apparatus allows the ink dispenser to be changed with no or minimal realignment. This is accomplished by the sliding up and down of the pedestal, which allows the ink dispenser to be changed, without changing the alignment controls and without putting the ink dispenser out of alignment. The pedestal can be slide back down in place and secured. This method allows an ink dispenser to be changed in approximately 5 minutes compared to approximately 30 minutes with prior art structure. With the prior art structure the ink dispenser must be totally realigned each time it is changed.

In addition, with the present apparatus, when alignment is required, the vertical, lateral, and angular alignment adjustments can be made much quicker because of the superior sensitivity of the vertical control adjuster 46, the joy stick 48 lateral and angle control screw 50.

While the invention has been particularly shown and described with reference to the preferred embodiments thereof, it will be understood by those skilled in the art that various changes in form and details may be made without departing from the spirit and scope of the invention.

What is claimed is:

1. An apparatus for dispensing ink onto a semiconductor chip in a semiconductor device tester, the semiconductor tester having a test head with an inside wall; the apparatus comprising:

a ring shaped support for attachment to said inside wall of the test head of said semiconductor tester, a pedestal slidably attached to said ring shaped support;

a vertical adjustment means on said ring shaped support for adjusting the vertical position of said pedestal;

a lateral adjustment means on said ring shaped support for adjusting the lateral position of said pedestal:

an angular adjustment means on said ring shaped support for adjusting the angle of the pedestal in relation to said semiconductor chip;

locking means on said ring shaped support to secure said vertical, lateral, and angular adjustments; and an ink dispenser mounted on the end of pedestal away from the ring shaped support;

means for mounting said ink dispenser on the end of pedestal away from the ring shaped support; whereby said ink dispenser can be aligned using said vertical, lateral, and angular adjusting means to place ink on said semiconductor chip.

2. The apparatus for dispensing ink of claim 1 wherein the support further comprises a ring, a first stage, a second stage, and a third stage.

3. The apparatus for dispensing ink of claim 1 wherein the pedestal is slidably attached to the support by a bracket.

4. The apparatus for dispensing ink of claim 1 wherein said vertical adjusting means comprises a vertical adjustment screw mounted on a bracket, the bracket slidably holds the pedestal whereby tightening or loosening the vertical adjustment screw raises or lowers the pedestal in relationship with the support.

5. The apparatus for dispensing ink of claim 2 wherein said lateral adjusting means comprises a joystick mounted on said third stage and connected to the second stage whereby adjusting the joystick laterally moves the ink dispenser on the pedestal.

6. The apparatus for dispensing ink of claim 2 wherein said angular adjusting means comprises an angle adjusting screw secured to the second stage, the angle adjusting screw connected to the first stage whereby the angle adjusting screw controls the distance between the first stage and second stage.

7. The apparatus for dispensing ink of claim 2 wherein said third stage further comprises guide pins.

8. The apparatus for dispensing ink of claim 1 wherein a holder including an ink dispenser adjusting screw, is attached to the pedestal, said ink dispenser is held in the holder, whereby the ink dispenser adjusting screw holds the ink dispenser to a vertical height.

9. The apparatus for dispensing ink of claim 1 wherein the ink dispenser comprises a ink compartment, a pen and a pen driving mechanism.

10. The apparatus for dispensing ink of claim 2 wherein the locking means comprises a first locking screw securing said second stage and said third stage in position; and a second locking screw securing said pedestal in vertical position within said bracket.

11. An apparatus for dispensing ink onto a semiconductor chip in a semiconductor device tester, the semiconductor tester having a test head with an inside wall, the apparatus comprising:

a ring shaped support for attachment to said inside wall of the test head of the semiconductor tester, the support including a ring, a first stage, a second stage, and a third stage and a bracket;

a pedestal slidably attached to the support by said bracket;

a vertical adjustment screw mounted on said bracket, said bracket slidably holds said pedestal whereby tightening or loosening said vertical adjustment screw raises or lowers said pedestal in relationship with said support;

a joystick mounted on said third stage and connected to said second stage;

an angle adjusting screw mounted on said second stage, the angle adjusting screw connected to said first stage whereby the angle adjusting screw controls the distance between said first stage and said second stage;

a first locking screw securing said second stage and said third stage in position;

a second locking screw securing the pedestal in vertical position within said bracket;

said third stage further includes guide pins;

an ink dispenser mounted on the end of said pedestal away from said ring shaped support;

a means for mounting said ink dispenser on the end of said pedestal away from the ring shaped support whereby the ink dispenser can be aligned using the adjusting means for mounting said ink dispenser to place ink on said semiconductor chip.

12. The apparatus for dispensing ink of claim 11 wherein said vertical adjusting means comprises a vertical adjustment screw mounted on said bracket, the bracket slidably holds the pedestal whereby tightening or loosing the vertical adjustment screw raises or lowers the pedestal in relationship with the support.

13. The apparatus for dispensing ink of claim 11 wherein a holder including an ink dispenser adjusting screw, is attached to said pedestal, said ink dispenser is held in the holder, whereby the adjusting screw holds the ink dispenser in a vertical position.

14. The apparatus for dispensing ink of claim 11 wherein the ink dispenser comprises a ink compartment, a pen and a pen driving mechanism.

* * * * *